United States Patent

(12) United States Patent
Lee et al.

(10) Patent No.: US 12,713,911 B2
(45) Date of Patent: Aug. 18, 2026

(54) SEMICONDUCTOR PACKAGE

(71) Applicant: Samsung Electronics Co., Ltd., Suwon-si (KR)

(72) Inventors: Eunsu Lee, Asan-si (KR); Wooyoung Park, Suwon-si (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 439 days.

(21) Appl. No.: 18/303,005

(22) Filed: Apr. 19, 2023

(65) Prior Publication Data

US 2023/0343670 A1 Oct. 26, 2023

(30) Foreign Application Priority Data

Apr. 26, 2022 (KR) ........................ 10-2022-0051655

(51) Int. Cl.
*H10W 40/22* (2026.01)
*H10W 40/40* (2026.01)
(Continued)

(52) U.S. Cl.
CPC ........... *H10W 40/22* (2026.01); *H10W 40/40* (2026.01); *H10W 70/611* (2026.01);
(Continued)

(58) Field of Classification Search
None
See application file for complete search history.

(56) References Cited

U.S. PATENT DOCUMENTS 8,853,564 B2 10/2014 Lo et al.
8,970,049 B2 3/2015 Karnezos
(Continued)

FOREIGN PATENT DOCUMENTS

JP H07-045761 A 2/1995
JP 2007-324544 A 12/2007
(Continued)

OTHER PUBLICATIONS

Korean Office Action dated Oct. 1, 2025 for corresponding Korean Patent Application No. 10-2022-0051655 and its English-languge translation.

(Continued)

*Primary Examiner* — Brent A. Fairbanks
*Assistant Examiner* — Derek L Nielsen
(74) *Attorney, Agent, or Firm* — HARNESS, DICKEY & PIERCE, P.L.C.

(57) ABSTRACT

A semiconductor package may include a first semiconductor chip flip-chip bonded to a top surface of a first circuit element, an insulating plate on the first circuit element and having a first through hole exposing the first semiconductor chip and a second through hole on one side portion of the insulating plate, a connection member in the second through hole and electrically connected to the first circuit element, a second circuit element on the connection member and the insulating plate and electrically connected to the connection member, a second semiconductor chip spaced apart from the first semiconductor chip in the first through hole and flip-chip bonded to a bottom surface of the second circuit element, and a fluid layer between the first semiconductor chip and the second semiconductor chip in the first through hole.

19 Claims, 16 Drawing Sheets

(51) Int. Cl.

| | |
|---|---|
| ***H10W 70/60*** | (2026.01) |
| ***H10W 70/685*** | (2026.01) |
| ***H10W 90/00*** | (2026.01) |

(52) U.S. Cl.

CPC ......... *H10W 70/685* (2026.01); *H10W 90/00* (2026.01); *H10W 90/401* (2026.01); *H10W 90/701* (2026.01); *H10W 90/724* (2026.01)

(56) References Cited

U.S. PATENT DOCUMENTS

| | | | | |
|---|---|---|---|---|
| 9,269,647 | B2 | 2/2016 | Du | |
| 10,186,499 | B2 | 1/2019 | Seidemann et al. | |
| 2006/0071314 | A1 | 4/2006 | Ho et al. | |
| 2017/0186728 | A1* | 6/2017 | Chainer | H10W 90/00 |
| 2020/0357721 | A1* | 11/2020 | Sankman | H10W 40/47 |
| 2021/0280497 | A1* | 9/2021 | Brun | H10W 40/40 |

FOREIGN PATENT DOCUMENTS

| | | | |
|---|---|---|---|
| JP | 2015-061076 | A | 3/2015 |
| JP | 2020-109821 | A | 7/2020 |
| KR | 101176350 | B1 | 8/2012 |

OTHER PUBLICATIONS

Korean Notice of Allowance dated Mar. 15, 2026 for corresponding Korean Patent Application No. 10-2022-0051655 and its English-languge translation.

* cited by examiner

FIG. 12

FGI. 14

SEMICONDUCTOR PACKAGE

CROSS-REFERENCE TO RELATED APPLICATION

This application is based on and claims priority under 35 U.S.C. § 119 to Korean Patent Application No. 10-2022-0051655, filed on Apr. 26, 2022 in the Korean Intellectual Property Office, the disclosure of which is incorporated by reference herein in its entirety.

BACKGROUND

Inventive concepts relate to a semiconductor package, and more particularly, to a semiconductor package capable of improving heat dissipation efficiency.

As a semiconductor chip (a semiconductor device) is miniaturized and the degree of integration is increased, a semiconductor package may need to effectively dissipate heat generated by the semiconductor chip. In particular, in a semiconductor package including two or more semiconductor chips to increase capacity or function, heat dissipation characteristics regarding heat generated by the semiconductor chips is more important.

SUMMARY

Inventive concepts provide a semiconductor package capable of improving heat dissipation characteristics.

According to an embodiment of inventive concepts, a semiconductor package may include a first circuit element; a first semiconductor chip flip-chip bonded to a top surface of the first circuit element; an insulating plate on the first circuit element, the insulating plate having a first through hole and a second through hole, the first through hole exposing the first semiconductor chip, the second through hole on one side of the insulating plate and spaced apart from the first semiconductor chip; a connection member in the second through hole and electrically connected to the first circuit element; a second circuit element on the connection member and the insulating plate, the second circuit element being electrically connected to the connection member; a second semiconductor chip, the second semiconductor chip being spaced apart from the first semiconductor chip in the first through hole and flip-chip bonded to a bottom surface of the second circuit element; and a fluid layer in the first through hole between the first semiconductor chip and the second semiconductor chip.

According to an embodiment of inventive concepts, a semiconductor package may include a first circuit element; a first semiconductor chip flip-chip bonded to a top surface of the first circuit element; a first heat dissipation structure on a rear surface of the first semiconductor chip, the first heat dissipation structure including a plurality of first patterns spaced apart from each other on the rear surface of the first semiconductor chip; an insulating plate on the first circuit element, the insulating plate having a first through hole and a second through hole, the first through hole exposing the first semiconductor chip, the second through hole on one side of the insulating plate and spaced apart from the first semiconductor chip; a connection member in the second through hole and electrically connected to the first circuit element; a second circuit element on the connection member and the insulating plate, the second circuit element electrically connected to the connection member; a second semiconductor chip, is the second semiconductor chip being spaced apart from the first semiconductor chip in the first through hole and flip-chip bonded to a bottom surface of the second circuit element; a second heat dissipation structure on a rear surface of the second semiconductor chip, the second heat dissipation structure including a plurality of second patterns spaced apart from each other on the rear surface of the second semiconductor chip; and a fluid layer between the first heat dissipation structure and the second heat dissipation structure in the first through hole.

According to an embodiment of inventive concepts, a semiconductor package may include a first circuit element including a first package substrate; a first semiconductor chip electrically connected to the first circuit element through first chip connection balls, the first semiconductor chip including a first chip body and the first chip connection balls, the first chip body including a first front surface and a first rear surface opposite the first front surface, the first chip connection balls being on the first front surface of the first chip body; a first heat dissipation structure including a plurality of first patterns on the first rear surface of the first semiconductor chip and spaced apart from each other; an insulating plate on the first circuit element, the insulating plate having a first through hole and a second through hole, the first through hole exposing the first semiconductor chip, the second through hole on one side of the insulating plate and spaced apart from the first semiconductor chip; a connection member in the second through hole and electrically connected to the first circuit element; a second circuit element on the connection member and the insulating plate, the second circuit element being electrically connected to the connection member, and the second circuit element including a redistribution level layer; a second semiconductor chip electrically connected to the second circuit element through second chip connection balls, the second semiconductor chip being spaced apart from the first semiconductor chip in the first through hole, the second semiconductor chip including a second chip body and the second chip connection balls, the second chip body having a second front surface and a second rear surface opposite the second front surface, the second chip connection balls being on the second rear surface of the second chip body, and the second semiconductor chip being spaced apart from the first semiconductor chip in the first through hole; a second heat dissipation structure on a second rear surface of the second semiconductor chip, the second heat dissipation structure including a plurality of second patterns on the second rear surface of the second semiconductor chip and spaced apart from each other; and a fluid layer between the first heat dissipation structure and the second heat dissipation structure in the first through hole.

BRIEF DESCRIPTION OF THE DRAWINGS

Embodiments of inventive concepts will be more clearly understood from the following detailed description taken in conjunction with the accompanying drawings in which:

FIG. 12 is a cross-sectional view of a semiconductor package according to an embodiment;

DETAILED DESCRIPTION OF THE EMBODIMENTS

Figure 1:
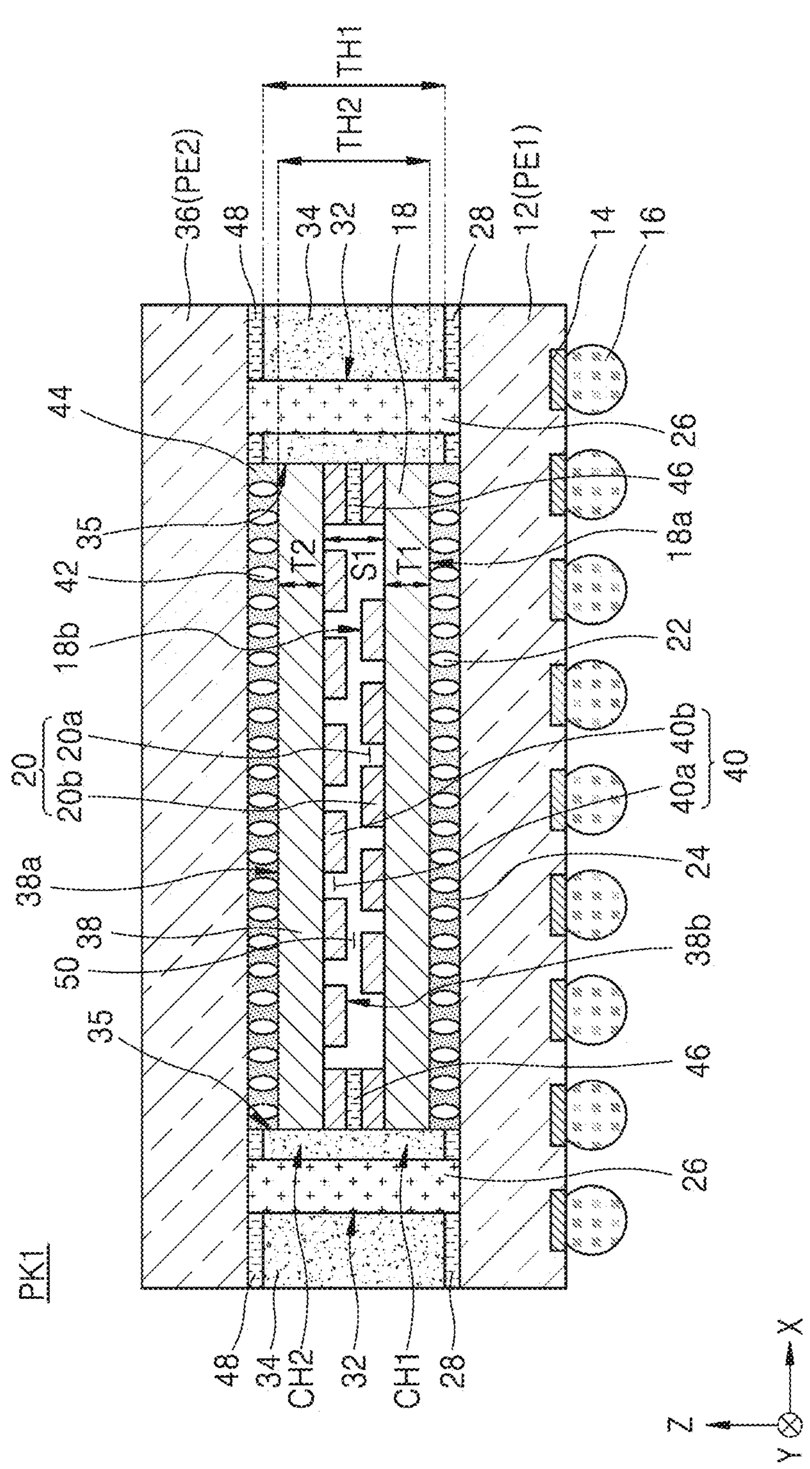
FIG. 1 is a cross-sectional view of a semiconductor package according to an embodiment.

FIG. 1 is a cross-sectional view of a semiconductor package according to an embodiment.

In detail, a semiconductor package PK1 may include a first circuit element PE1 and a first semiconductor chip CH1. The first semiconductor chip CH1 may be flip-chip bonded to the top surface of the first circuit element PE1. The first circuit element PE1 may be a first package substrate 12. The first package substrate 12 may be a printed circuit board. An external connection pad 14 may be disposed in the bottom surface of the first circuit element PE1. The external connection pad 14 may include a metal layer, e.g., a copper layer, a nickel layer, or a gold layer. An external connection terminal 16 may be formed on the external connection pad 14.

The first semiconductor chip CH1 may be a logic chip, a power management integrated circuit (PMIC) chip, or a memory chip. In some embodiments, the logic chip may each be, for example, a central processing unit (CPU) chip, a graphics processing unit (GPU) chip, or an application processor (AP) chip.

In some embodiments, the memory chip may be a dynamic random access memory (DRAM) chip, a static random access memory (SRAM) chip, a flash memory chip, an electrically erasable and programmable read-only memory, (EEPROM) chip, a phase-change random access memory (PRAM) chip, a magnetic random access memory (MRAM) chip, or a resistive random access memory (RRAM) chip.

The first semiconductor chip CH1 may include a first chip body 18 having a first front surface 18*a* and a first rear surface 18*b*. The first semiconductor chip CH1, that is, the first chip body 18, may have a first thickness T1. The first thickness T1 may be several hundred micrometers (μm), e.g., from about 100 μm to about 400 μm.

The first front surface 18*a* may be an active surface, and the first rear surface 18*b* may be an inactive surface. First chip connection balls 22 are arranged on the first front surface 18*a* of the first chip body 18. A first chip connection ball 22 may be a first chip solder ball or a first chip connection bump. A first underfill layer 24 is disposed between the first chip connection balls 22 on the first circuit element PE1.

A first heat dissipation structure 20 having a concave-convex structure may be positioned on the upper portion of the first semiconductor chip CH1. The first heat dissipation structure 20 may be included in the first semiconductor chip CH1. The first heat dissipation structure 20 may include a plurality of first concave patterns 20*a* recessed from the first semiconductor chip CH1, that is, from the first rear surface 18*b* of the first chip body 18, and a plurality of first convex patterns 20*b* arranged between the first concave patterns 20*a*.

The first heat dissipation structure 20 may be formed by etching the first rear surface 18*b* of the first chip body 18 through a photolithography process. Since the first semiconductor chip CH1 includes the first heat dissipation structure 20, heat may be easily dissipated from the first semiconductor chip CH1.

The semiconductor package PK1 may include an insulating plate 34 and a connection member 26 disposed on the insulating plate 34. The insulating plate 34 may be disposed on the first circuit element PE1 to have a first through hole 35 exposing the first semiconductor chip CH1. The insulating plate 34 may be referred to as a solder plate. The insulating plate 34 may include a resin layer. The first through hole 35 may be a central through hole located in the central portion of the insulating plate 34.

The insulating plate 34 may include a fluid inlet for supplying a fluid onto a plane, that is, an X-Y plane, and a fluid outlet for discharging the fluid, as will be described later. The planar structure of the insulating plate 34 is described in more detail later.

The insulating plate 34 may be adhered to the first circuit element PE1 through an adhesive layer 28. A thickness TH1 of the insulating plate 34 may be greater than a first thickness T1 of the first semiconductor chip CH1. Therefore, the first semiconductor chip CH1 may be located inside the first through hole 35.

A second through hole 32 is further formed on one side portion of the insulating plate 34 to be spaced apart from the first semiconductor chip CH1. The second through hole 32 may be a peripheral through hole located in the periphery of the insulating plate 34. The connection member 26 electrically connected to the first circuit element PE1 may be disposed in the second through hole 32.

The connection member 26 may be a column-like member in which the width of the upper portion thereof is the same as the width of the lower portion thereof. The connection member 26 may be a connecting solder ball or a connecting solder bump. The connection member 26 may be electrically connected to an internal wiring layer (not shown) formed inside the first circuit element PE1.

The semiconductor package PK1 may include a second circuit element PE2 and a second semiconductor chip CH2. The second circuit element PE2 may be a second package substrate 36. The second package substrate 36 may be a second printed circuit board. The second circuit element PE2 may be positioned above the insulating plate 34 and the connection member 26. The second circuit element PE2 may be attached to the insulating plate 34 through an adhesive layer 48.

The second semiconductor chip CH2 may be positioned to be spaced apart from the first semiconductor chip CH1 in a vertical direction (Z direction) inside the first through hole 35. The second semiconductor chip CH2 may be flip-chip bonded to the bottom surface of the second circuit element PE2. The second semiconductor chip CH2 may be bonded to the first semiconductor chip CH1 through an adhesive layer 46.

In some embodiments, the second semiconductor chip CH2 may be the same type of chip as the first semiconductor chip CH1. In some embodiments, the second semiconductor chip CH2 may be a different type of chip from the first semiconductor chip CH1.

The second semiconductor chip CH2 may include a second chip body 38 having a second front surface 38*a* and a second rear surface 38*b*. The second semiconductor chip CH2, that is, the second chip body 38, may have a second thickness T2. The second thickness T2 may be several hundred um, e.g., from about 100 um to about 400 um.

The second front surface 38*a* may be an active surface, and the second rear surface 38*b* may be an inactive surface. Second chip connection balls 42 are arranged on the second front surface 38*a* of the second chip body 38. A second chip connection ball 42 may be a second chip solder ball or a second chip connection bump. A second underfill layer 44 is disposed between the second chip connection balls 42 on the bottom surface of the second circuit element PE2.

The above-stated thickness TH1 of the insulating plate 34 may be greater than a thickness TH2, which is the sum of the first thickness T1 of the first semiconductor chip CH1, the second thickness T2 of the second semiconductor chip CH2, and a separation distance S1 between the first chip body 18 and the second chip body 38 in the vertical direction (Z direction). Therefore, the first semiconductor chip CH1 and the second semiconductor chip CH2 may be located inside the first through hole 35.

The thickness TH1 of the insulating plate 34 may be determined by the first thickness T1, the second thickness T2, and the separation distance S1. The thickness TH1 of the insulating plate 34 may be several hundred um, e.g., from about 300 um to 900 um.

A second heat dissipation structure 40 having a concave-convex structure may be positioned on the lower portion of the second semiconductor chip CH2. The second heat dissipation structure 40 may be included in the second semiconductor chip CH2. The second heat dissipation structure 40 may include a plurality of second concave patterns 40*a* recessed from the second semiconductor chip CH2, that is, from the second rear surface 38*b* of the second chip body 38, and a plurality of second convex patterns 40*b* arranged between the second concave patterns 40*a*.

The second heat dissipation structure 40 may be formed by etching the second rear surface 38*b* of the second chip body 38 through a photolithography process. Since the second semiconductor chip CH2 includes the second heat dissipation structure 40, heat may be easily dissipated from the second semiconductor chip CH2.

The semiconductor package PK1 may include a fluid layer 50. The fluid layer 50 may include a liquid or a gas. The fluid layer 50 may include at least any one of ammonia, nitrogen, carbon dioxide, hydrochlorofluorocarbon (HCFC), glycerin, water, and oil.

The fluid layer 50 may be positioned between the first semiconductor chip CH1 and the second semiconductor chip CH2 inside the first through hole 35. The fluid layer 50 may be positioned between the first heat dissipation structure 20 and the second heat dissipation structure 40 inside the first through hole 35.

The fluid layer 50 may be positioned in contact with the first heat dissipation structure 20 and the second heat dissipation structure 40. The fluid layer 50 may be positioned to surround the first concave patterns 20*a* and the first convex patterns 20*b* of the first heat dissipation structure 20. The fluid layer 50 may be positioned to surround the second concave patterns 40*a* and the second convex patterns 40*b* of the second heat dissipation structure 40. The fluid layer 50 may exhibit superior heat dissipation efficiency as compared to a solid layer.

As described above, the semiconductor package PK1 includes the fluid layer 50, thereby facilitating dissipation of heat generated in the first semiconductor chip CH1 and the second semiconductor chip CH2 to the outside. Furthermore, the semiconductor package PK1 includes the first heat dissipation structure 20 and the second heat dissipation structure 40, thereby further facilitating dissipation of heat generated in the first semiconductor chip CH1 and the second semiconductor chip CH2 to the outside.

Figure 2:
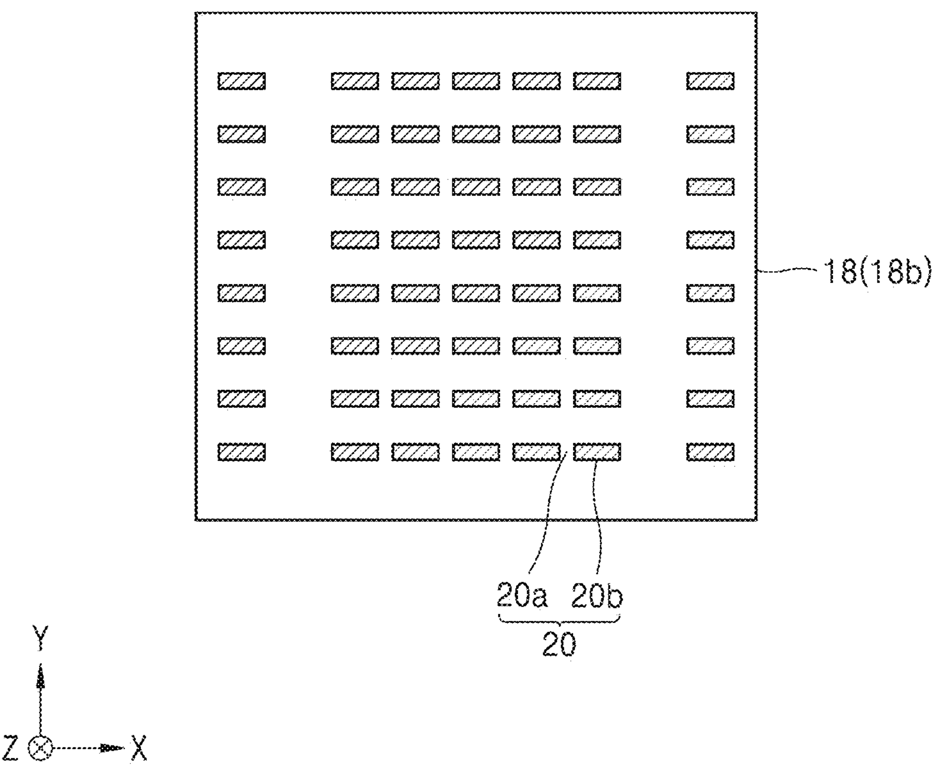
FIG. 2 is a top plan view of a first semiconductor chip included in the semiconductor package of FIG. 1.

FIG. 2 is a top plan view of a first semiconductor chip included in the semiconductor package of FIG. 1.

In FIG. 2, reference numerals identical to those as in FIG. 1 denote the same elements. In FIG. 2, descriptions identical to those given above with reference to FIG. 1 will be briefly given or omitted. The first semiconductor chip CH1 may include the first chip body 18 as described above.

The first chip body 18 may include the first rear surface 18*b*. The first heat dissipation structure 20 having a concave-convex structure may be formed on the first rear surface 18*b* of the first chip body 18. The first heat dissipation structure 20 may be formed by etching the first rear surface 18*b* of the first chip body 18 through a photolithography process.

The first heat dissipation structure 20 may include the first concave patterns 20*a* and the first convex patterns 20*b* arranged between the first concave patterns 20*a*. The first convex patterns 20*b* may be arranged on the X-Y plane to be spaced apart from one another. As the first convex patterns 20*b* are formed, the first concave patterns 20*a* may be arranged between the first convex patterns 20*b*.

The number of first convex patterns 20*b* may vary. Although FIG. 2 shows that the planar shape of the first convex patterns 20*b* is a rectangular shape, the planar shape of the first convex patterns 20*b* may also be a polygonal shape, e.g., a triangular shape, a square shape, a pentagonal shape, etc. Since the first semiconductor chip CH1 includes the first heat dissipation structure 20 having the first concave patterns 20*a* and the first convex patterns 20*b* when viewed from above, heat may be easily dissipated from the first semiconductor chip CH1.

Figure 3:
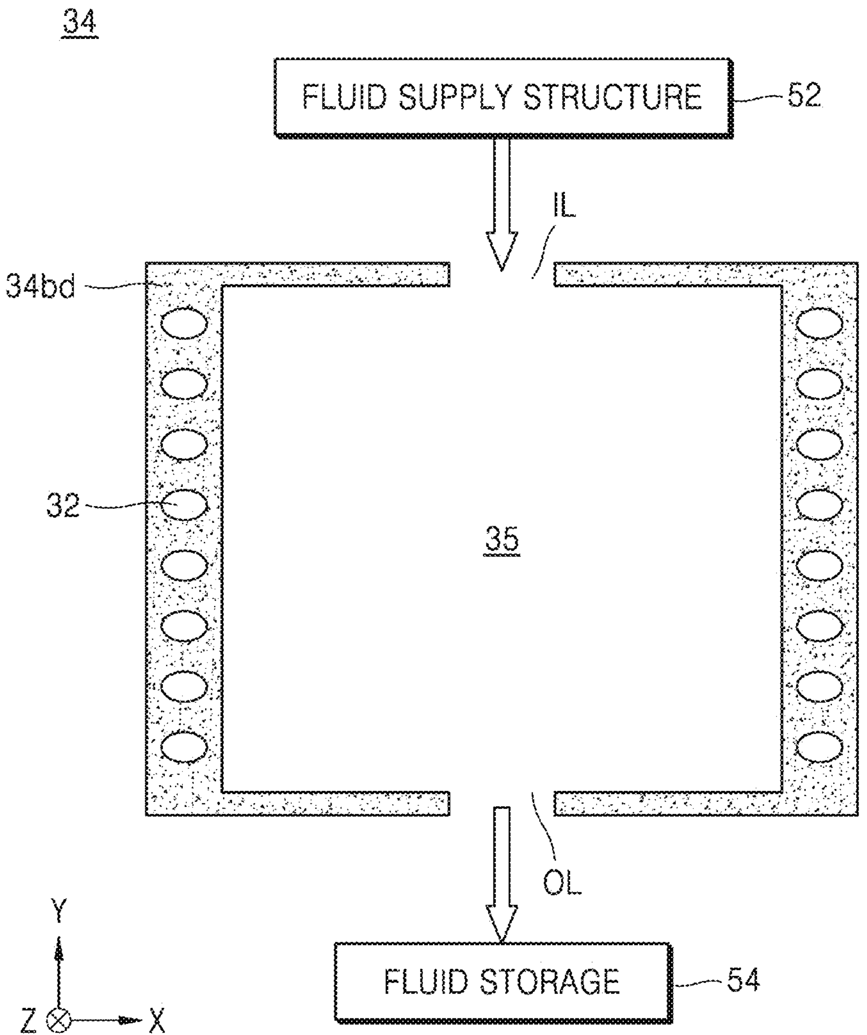
FIG. 3 is a top plan view of an insulating plate included in the semiconductor package of FIG. 1.

FIG. 3 is a top plan view of an insulating plate included in the semiconductor package PK1 of FIG. 1.

In FIG. 3, reference numerals identical to those as in FIG. 1 denote the same elements. In FIG. 3, descriptions identical to those given above with reference to FIG. 1 are briefly given or omitted. The insulating plate 34 may include a plate body 34*bd* having the first through hole 35 and second through holes 32, a fluid inlet IL, and a fluid outlet OL.

The first through hole 35 may be a portion exposing the first semiconductor chip CH1 in the semiconductor package PK1. The first through hole 35 may be a central through hole formed in the central portion of the plate body 34*bd*. The first through hole 35 may be a single through hole penetrating through the plate body 34*bd*.

The second through holes 32 may be a portion in which the connection member 26 is formed. The second through holes 32 may be peripheral through holes formed in the periphery of the plate body 34*bd*. The second through holes 32 may be provided to be spaced apart from one another in the Y direction.

The fluid inlet IL may be an inlet through which a fluid may be supplied between the first semiconductor chip CH1 and the second semiconductor chip CH2 in the vertical direction (Z direction). A fluid supply structure 52 may be connected to the fluid inlet IL. The fluid layer 50 may fill the first through hole 35 positioned between the first semiconductor chip CH1 and the second semiconductor chip CH2.

The fluid outlet OL may be an outlet capable of discharging a fluid supplied between the first semiconductor chip CH1 and the second semiconductor chip CH2 in the vertical direction (Z direction). The fluid outlet OL may be disposed to face the fluid inlet IL on the X-Y plane. A fluid storage 54 may be connected to the fluid outlet OL.

Figure 4:
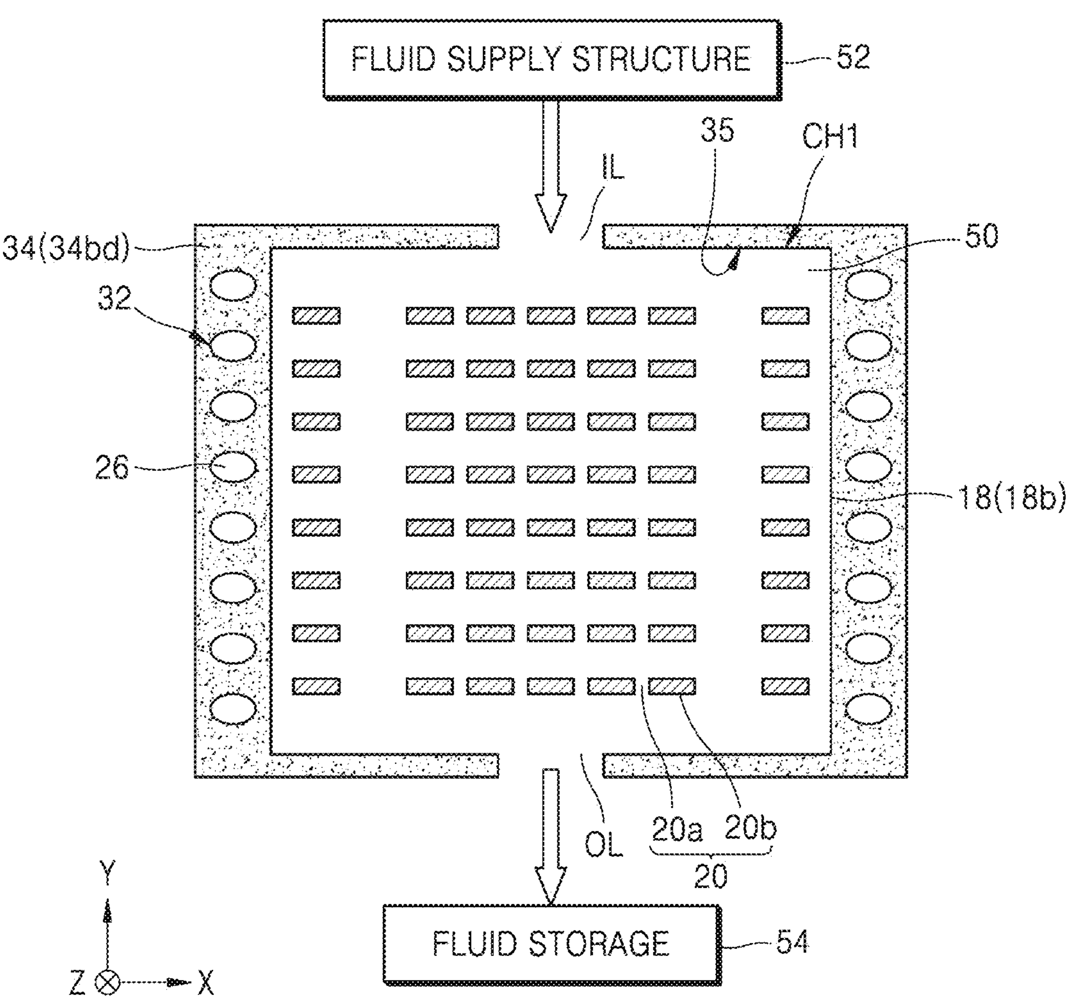
FIG. 4 is a top plan view of a first semiconductor chip, an insulating plate, and a fluid layer included in the semiconductor package of FIG. 1.

FIG. 4 is a top plan view of a first semiconductor chip, an insulating plate, and a fluid layer included in the semiconductor package of FIG. 1.

In FIG. 4, reference numerals identical to those as in FIG. 1 denote the same elements. In FIG. 4, descriptions identical to those given above with reference to FIG. 1 are briefly given or omitted. The first semiconductor chip CH1 may be disposed in the first through hole 35 of the insulating plate 34, that is, the plate body 34*bd*.

The first chip body 18 having the first rear surface 18*b* of the first semiconductor chip CH1 may be exposed. The first heat dissipation structure 20 including the first concave patterns 20*a* and the first convex patterns 20*b* arranged between the first concave patterns 20*a* may be provided on the first chip body 18.

The first concave patterns 20*a* and the first convex patterns 20*b* may be formed by etching the first rear surface 18*b* of the first chip body 18 through a photolithography process. As described above, the first concave patterns 20*a* may be formed by recessing from the first rear surface 18*b*.

The fluid layer 50 supplied through the fluid inlet IL may be disposed on the first chip body 18 of the first semiconductor chip CH1 in the first through hole 35. The fluid inlet IL may be connected to the fluid supply structure 52 as described above.

The fluid layer 50 may be in contact with the first heat dissipation structure 20 on the X-Y plane. The fluid layer 50 may contact the first concave patterns 20*a* and the first convex patterns 20*b* of the first heat dissipation structure 20 on the X-Y plane.

The fluid layer 50 supplied onto the first chip body 18 of the first semiconductor chip CH1 in the first through hole 35 may be discharged through the fluid outlet OL. The fluid outlet OL may be connected to the fluid storage 54.

Figure 5:
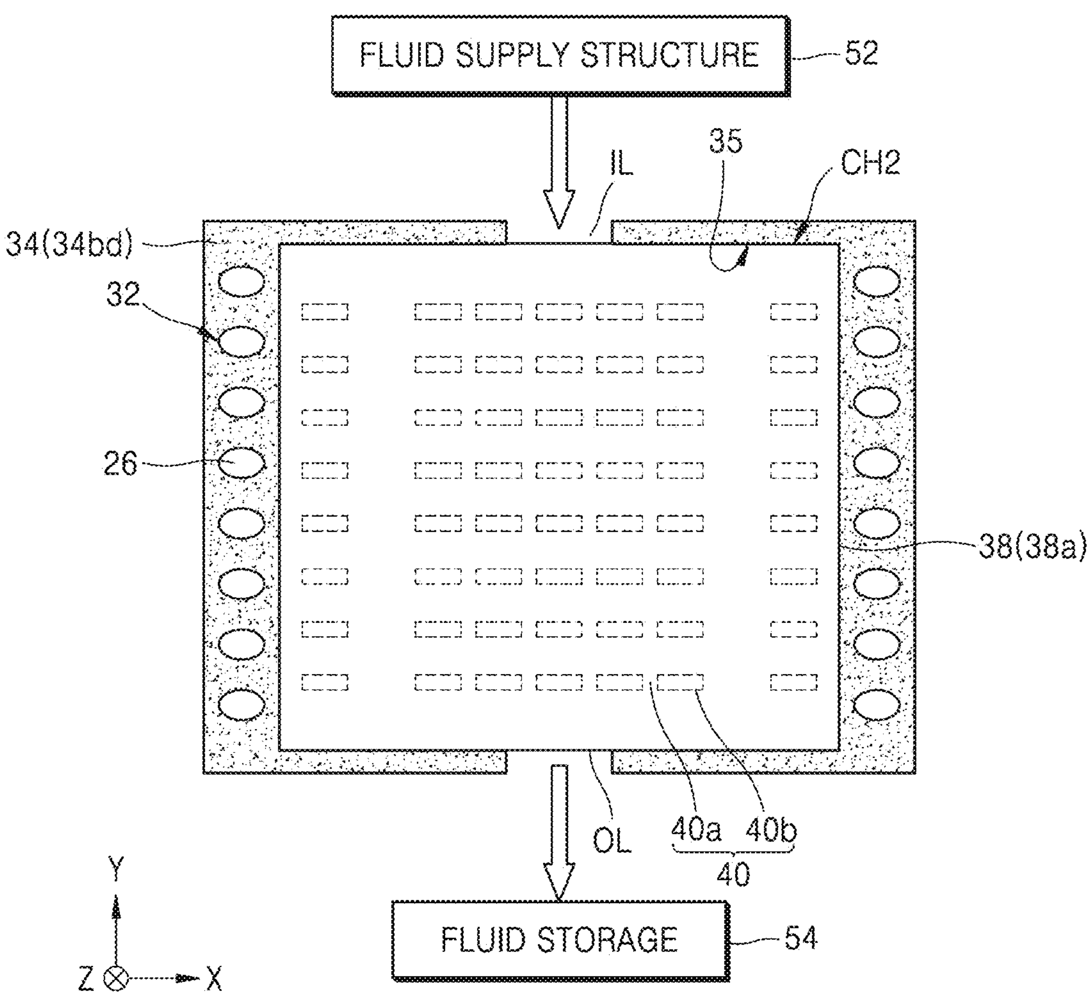
FIG. 5 is a top plan view of an insulating plate and a second semiconductor chip included in the semiconductor package of FIG. 1.
Figure 6:
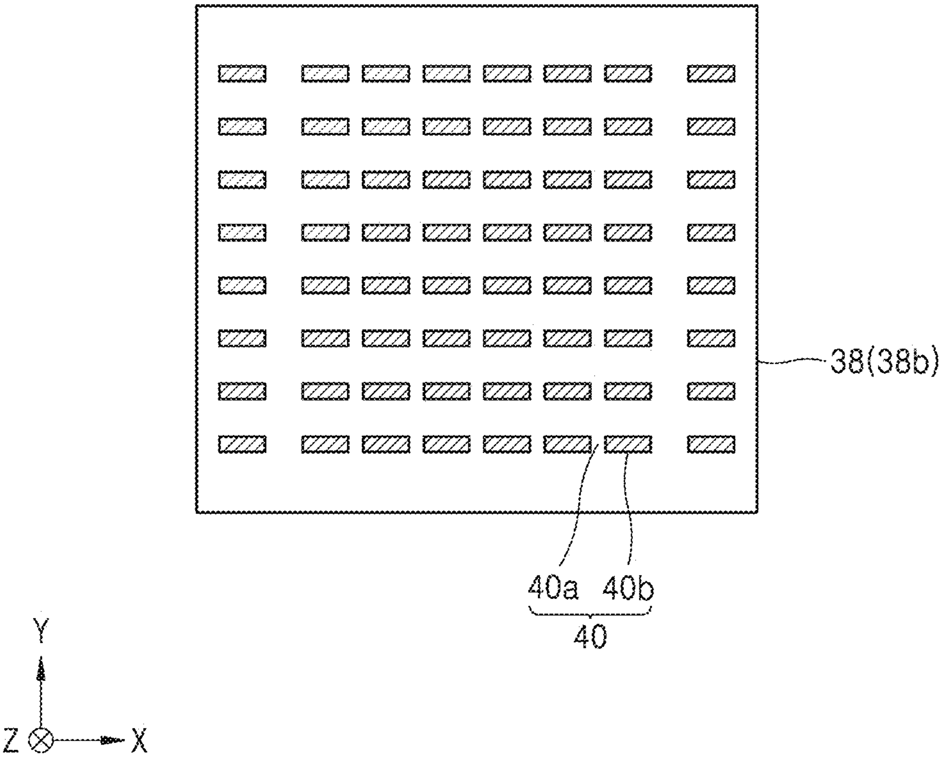
FIG. 6 is a bottom plan view of a second semiconductor chip included in the semiconductor package of FIG. 1.

FIG. 5 is a top plan view of an insulating plate and a second semiconductor chip included in the semiconductor package of FIG. 1, and FIG. 6 is a bottom plan view of a second semiconductor chip included in the semiconductor package of FIG. 1.

In FIGS. 4 and 5, reference numerals identical to those as in FIG. 1 denote the same elements. In FIGS. 5 and 6, descriptions identical to those given above with reference to FIG. 1 are briefly given or omitted. The second semiconductor chip CH2 may be disposed on the first semiconductor chip CH1 in the first through hole 35 of the insulating plate 34, that is, the plate body 34*bd*.

The fluid layer 50 supplied through the fluid inlet IL may be disposed between the first semiconductor chip CH1 and the second semiconductor chip CH2 in the first through hole 35. In FIG. 5, the first semiconductor chip CH1 and the fluid layer 50 are not shown.

The second semiconductor chip CH2 may include the second chip body 38 having the second front surface 38*a* and the second rear surface 38*b*. The second heat dissipation structure 40 including the second concave patterns 40*a* and the second convex patterns 40*b* arranged between the second concave patterns 40*a* may be disposed on the second rear surface 38*b* of the second chip body 38.

The second concave patterns 40*a* and the second convex patterns 40*b* may be formed by etching the second rear surface 38*b* through a photolithography process. As described above, the second concave patterns 40*a* may be formed by recessing from the second rear surface 38*b*. The second convex patterns 40*b* may be arranged on the X-Y plane to be spaced apart from one another.

The number of second convex patterns 40*b* may vary. Although FIG. 2 shows that the planar shape of the second convex patterns 40*b* is a rectangular shape, the planar shape of the second convex patterns 40*b* may also be a polygonal shape, e.g., a triangular shape, a square shape, a pentagonal shape, etc. Since the second semiconductor chip CH2 includes the second heat dissipation structure 40 having the second concave patterns 40*a*and the second convex patterns 40*b* when viewed from above, heat may be easily dissipated from the second semiconductor chip CH2.

Figure 7:
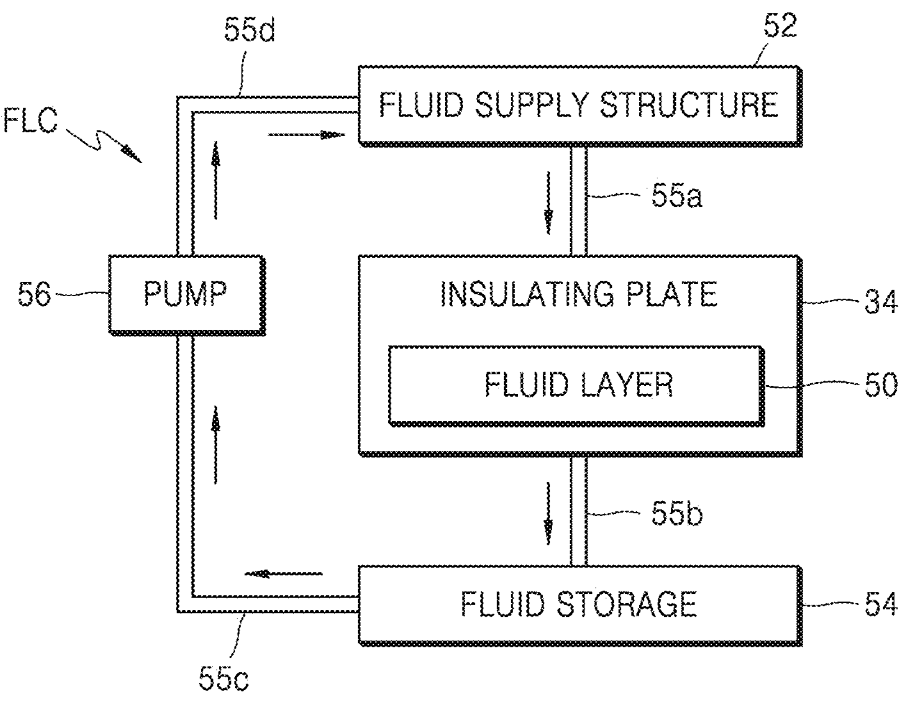
FIG. 7 is a drawing for describing a fluid circulation device that may be included in a semiconductor package according to an embodiment.

FIG. 7 is a drawing for describing a fluid circulation device that may be included in a semiconductor package according to an embodiment.

In detail, FIG. 7 may be a diagram for describing a fluid circulation device FLC that may be included in the semiconductor package PK1 of FIGS. 1 to 6. In FIG. 7, reference numerals identical to those as in FIGS. 1 to 6 denote the same elements. In FIG. 7, descriptions identical to those given above with reference to FIGS. 1 to 6 are briefly given or omitted.

The fluid circulation device FLC may include a plurality of fluid pipes 55*a*, 55*b*, 55*c*, and 55*d* and a pump 56 that may be connected to the fluid pipes 55*a*, 55*b*, 55*c*, and 55*d* to circulate a fluid. The fluid pipes 55*a*, 55*b*, 55*c*, and 55*d* may be a fluid supply pipe, a fluid discharge pipe, or a fluid circulation pipe. The fluid supply pipe 55*a* may be connected to the fluid supply structure 52. The fluid supply pipe 55*a* may be connected to the insulating plate 34.

As described above, a fluid supplied from the fluid supply structure 52 to the insulating plate 34 may form the fluid layer 50 between the first semiconductor chip CH1 and the second semiconductor chip CH2. The fluid layer 50 may be located inside the insulating plate 34.

The fluid discharge pipe 55*b* and the fluid storage 54 may be connected to the insulating plate 34. The fluid discharge pipe 55*b* may discharge a fluid supplied to the insulating plate 34 to the fluid storage 54. The fluid storage 54 may store a fluid discharged through the fluid discharge pipe 55*b*.

The fluid storage 54 may be connected to the first fluid circulation pipe 55*c*, the pump 56, and the second fluid circulation pipe 55*d*. The second fluid circulation pipe 55*d* may be connected to the fluid supply structure 52. The pump 56 may supply a fluid stored in the fluid storage 54 to the fluid supply structure 52 through the first fluid circulation pipe 55*c* and the second fluid circulation pipe 55*d*. Through the configuration, the semiconductor package PK1 may circulate a fluid supplied to the insulating plate 34 through the fluid circulation device FLC, thereby limiting and/or preventing consumption of the fluid. The fluid supply structure 52 may include a flow regulation structure (e.g., a valve) and/or a flow-direction structure (e.g., quarter turn pipe) connecting the fluid pipes 55*a* and 55*d* to teach other. The fluid storage 54 may include a reservoir or cavity in fluid communication with the fluid pipes 55*b* and 55*c*. However, example embodiments are not limited thereto.

Figure 8:
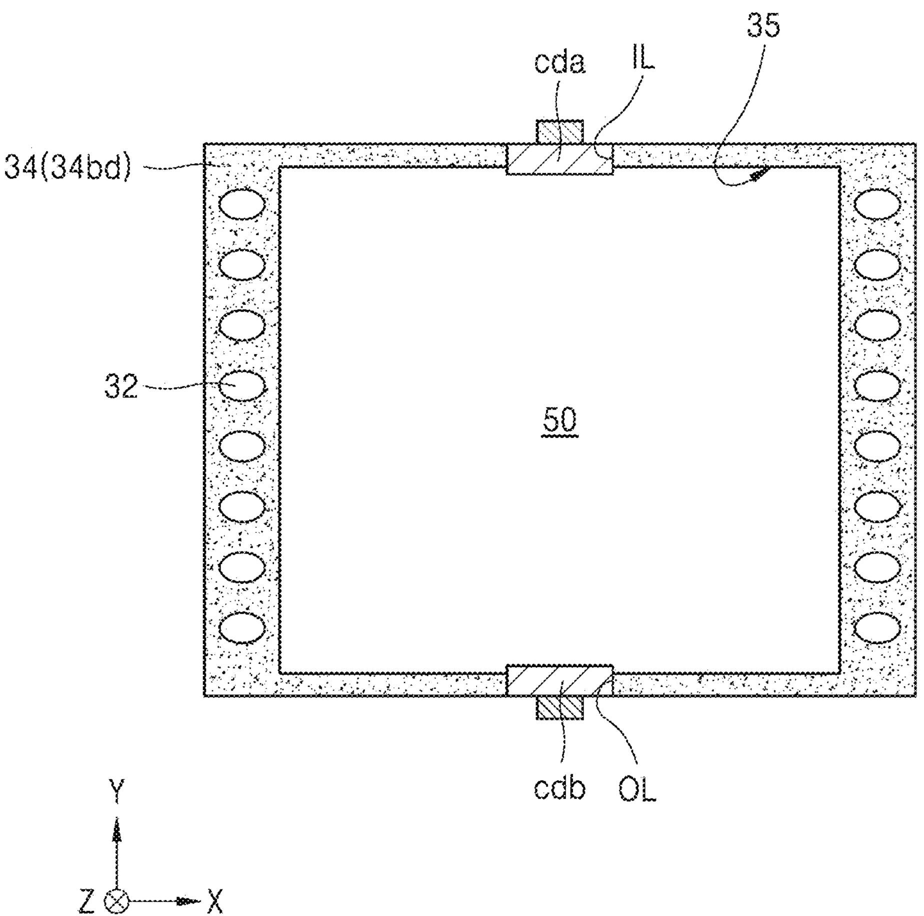
FIG. 8 is a top plan view including sealing portions that may be installed on an insulating plate of a semiconductor package according to an embodiment.

FIG. 8 is a top plan view including sealing portions that may be installed on an insulating plate of a semiconductor package according to an embodiment.

In detail, FIG. 8 may be a diagram for describing first and second sealing portions cda and cdb that may be installed on the insulating plate 34 of the semiconductor package PK1 of FIGS. 1 to 6. In FIG. 8, reference numerals identical to those as in FIGS. 1 to 6 denote the same elements. In FIG. 8, descriptions identical to those given above with reference to FIGS. 1 to 6 are briefly given or omitted.

As described above, the insulating plate 34, that is, the plate body 34*bd*, may include the fluid inlet IL and the fluid outlet OL in correspondence to the fluid inlet IL. The fluid inlet IL and fluid outlet OL may be openings defined in the plate body 34*bd*. A first sealing portion cda and a second sealing portion cdb for limiting and/or preventing loss of a fluid may be installed at the fluid inlet IL and the fluid outlet OL. The first sealing portion cda and the second sealing portion cdb may be stoppers that limits and/or prevents loss of a fluid.

The first sealing portion cda and the second sealing portion cdb may limit and/or prevent loss of a fluid supplied between the first semiconductor chip CH1 and the second semiconductor chip CH2 in the first through hole 35 of the insulating plate 34. Therefore, the fluid layer 50 may be positioned between the first semiconductor chip CH1 and the second semiconductor chip CH2 in the first through hole 35 of the insulating plate 34.

Figure 9:
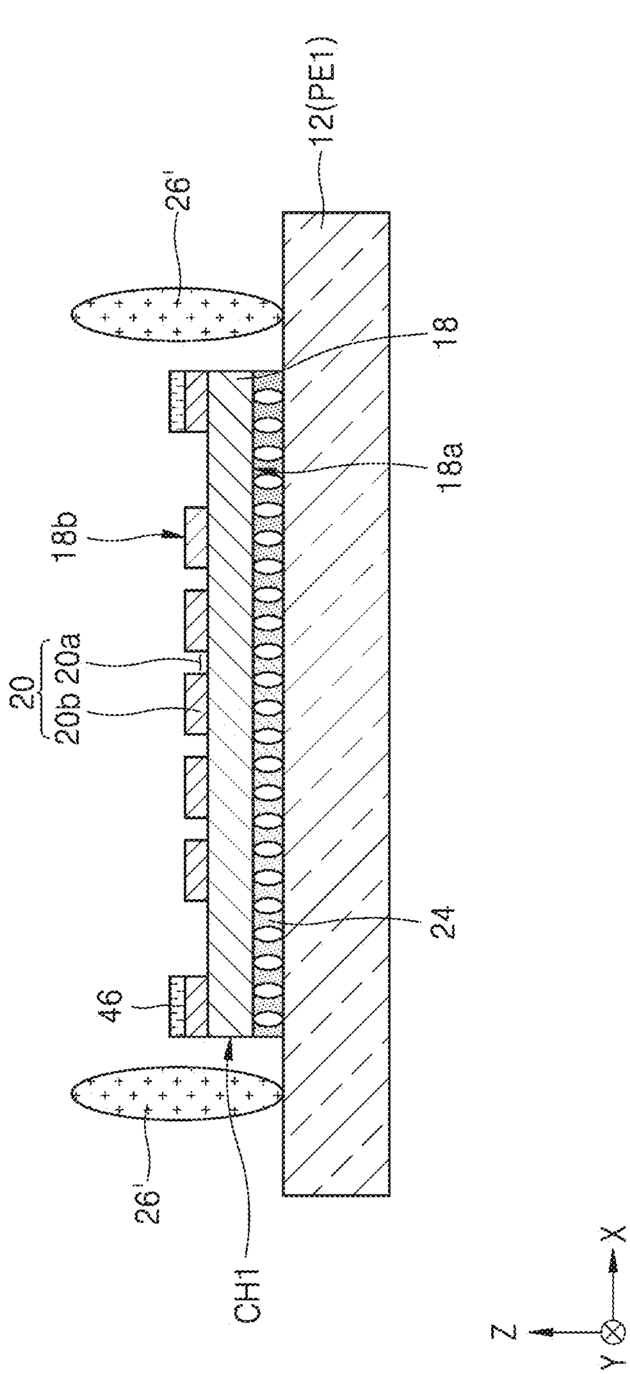
FIGS. 9 to 11 are cross-sectional views for describing a method of manufacturing the semiconductor package of FIG. 1.
Figure 10:
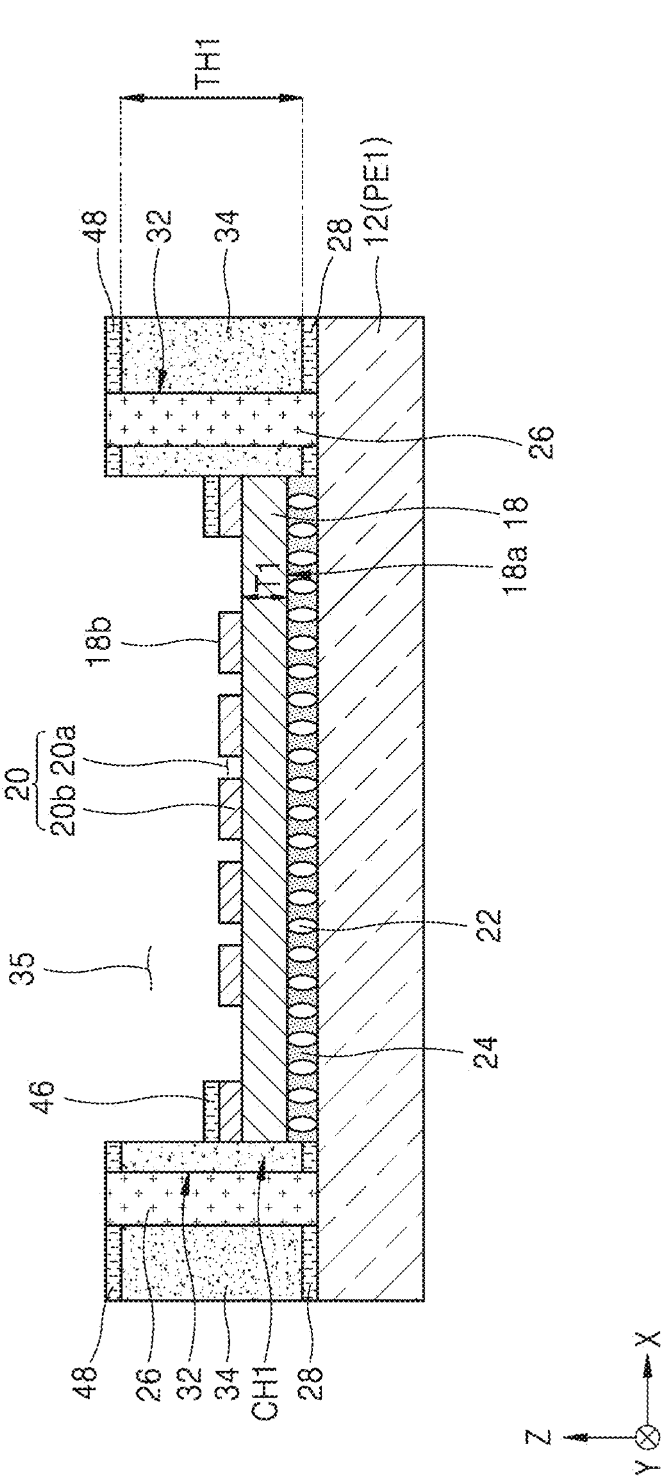
Figure 11:
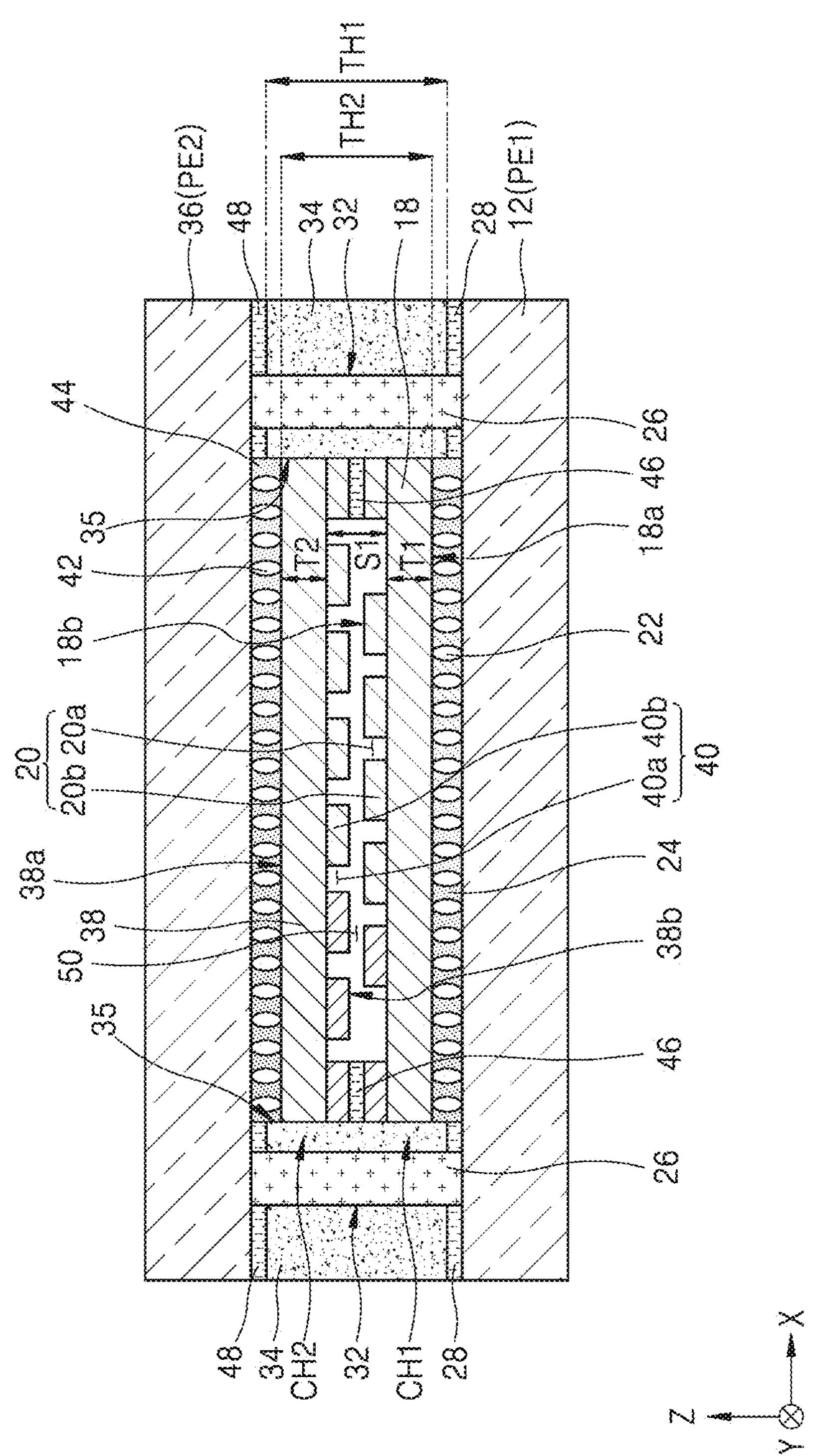

FIGS. 9 to 11 are cross-sectional views for describing a method of manufacturing the semiconductor package of FIG. 1.

In FIGS. 9 to 11, reference numerals identical to those as in FIG. 1 denote the same elements. In FIGS. 9 to 11, descriptions identical to those given above with reference to FIG. 1 are briefly given or omitted.

Referring to FIG. 9, the first semiconductor chip CH1 is flip-chip bonded onto the first circuit element PE1. The first circuit element PE1 may be the first package substrate 12. The first package substrate 12 may be a printed circuit board.

The first semiconductor chip CH1 may include the first chip body 18 having the first front surface 18*a* and the first rear surface 18*b*. The first front surface 18*a* may be an active surface, and the first rear surface 18*b* may be an inactive surface. First chip connection balls 22 may be arranged on the first front surface 18*a*.

The first semiconductor chip CH1 is bonded to the first circuit element PE1 by using the first chip connection balls 22. The first underfill layer 24 may be formed between the first chip connection balls 22 on the first circuit element PE1 to protect the first chip connection balls 22.

The first heat dissipation structure 20 having a concave-convex structure may be formed on the upper portion of the first semiconductor chip CH1. The first heat dissipation structure 20 may include the first concave patterns 20*a* recessed from the first semiconductor chip CH1, that is, from the first rear surface 18*b* of the first chip body 18, and the first convex patterns 20*b* arranged between the first concave patterns 20*a*.

The first heat dissipation structure 20 may be formed by etching the first rear surface 18*b* of the first chip body 18 through a photolithography process. Since the first semiconductor chip CH1 includes the first heat dissipation structure 20, heat may be easily dissipated from the first semiconductor chip CH1. The adhesive layer 46 may be disposed on the first convex patterns 20*b* arranged on both side portions of the first chip body 18.

A preliminary connection member 26' is formed on the first circuit element PE1. The preliminary connection member 26' is formed on the first circuit element PE1 on both side portions of the first semiconductor chip CH1. The preliminary connection member 26' may be a preliminary connection solder ball or a preliminary connection solder bump.

Referring to FIG. 10, the insulating plate 34 is attached onto the first circuit element PE1 and the preliminary connection member 26' (FIG. 9) through the adhesive layer 28 to expose the first semiconductor chip CH1.

The first semiconductor chip CH1 and the preliminary connection member 26' are positioned in the first through hole 35 and the second through hole 32 of the insulating plate 34, respectively. The thickness TH1 of the insulating plate 34 may be greater than the first thickness T1 of the first semiconductor chip CH1. Therefore, the first semiconductor chip CH1 may be located inside the first through hole 35. The first heat dissipation structure 20 of the first semiconductor chip CH1 may be exposed to the outside in the first through hole 35.

Subsequently, in FIG. 10, the connection member 26 is formed by reflowing the preliminary connection member 26'. The connection member 26 may be formed as a column-like member in which the width of the upper portion thereof is the same as the width of the lower portion thereof. The adhesive layer 48 may be formed on the insulating plate 34 for a subsequent process.

Referring to FIG. 11, the second circuit element PE2, to which the second semiconductor chip CH2 is flip-chip bonded, is attached onto the insulating plate 34 and the connection member 26 but using an adhesive layer 48. The second circuit element PE2 may be the second package substrate 36.

When the second circuit element PE2 is attached, the second semiconductor chip CH2 may be positioned to be spaced apart from the first semiconductor chip CH1 in the vertical direction (Z direction) inside the first through hole 35. Both side portions of the second semiconductor chip CH2 may be bonded to the first semiconductor chip CH1 through the adhesive layer 46.

As described above, the second semiconductor chip CH2 may include the second chip body 38 having the second front surface 38*a* and the second rear surface 38*b*. The second chip connection balls 42 are arranged on the second front surface 38*a*. The second underfill layer 44 may be formed between the second chip connection balls 42 on the bottom surface of the second circuit element PE2.

The second semiconductor chip CH2 may have the second thickness T2. The thickness TH1 of the insulating plate 34 may be greater than the thickness TH2, which is the sum of the first thickness T1 of the first semiconductor chip CH1, the second thickness T2 of the second semiconductor chip CH2, and the separation distance S1 between the first chip body 18 and the second chip body 38 in the vertical direction (Z direction). Therefore, the first semiconductor chip CH1 and the second semiconductor chip CH2 may be located inside the first through hole 35.

The second heat dissipation structure 40 having a concave-convex structure may be positioned on the lower portion of the second semiconductor chip CH2. The second heat dissipation structure 40 may include the second concave patterns 40*a* recessed from the second rear surface 38*b* of the second chip body 38 and the second convex patterns 40*b* arranged between the second concave patterns 40*a*.

The fluid layer 50 may be formed in the first through hole 35 of the insulating plate 34 between the first semiconductor chip CH1 and the second semiconductor chip CH2. As described above, the fluid layer 50 may be formed by supplying a fluid through the fluid inlet IL of the insulating plate 34. The fluid layer 50 may be positioned between the first heat dissipation structure 20 and the second heat dissipation structure 40 inside the first through hole 35.

Subsequently, as shown in FIG. 1, the semiconductor package PK1 is completed by forming the external connection terminal 16 on the external connection pad 14 on the bottom surface of the first circuit element PE1.

Figure 12:
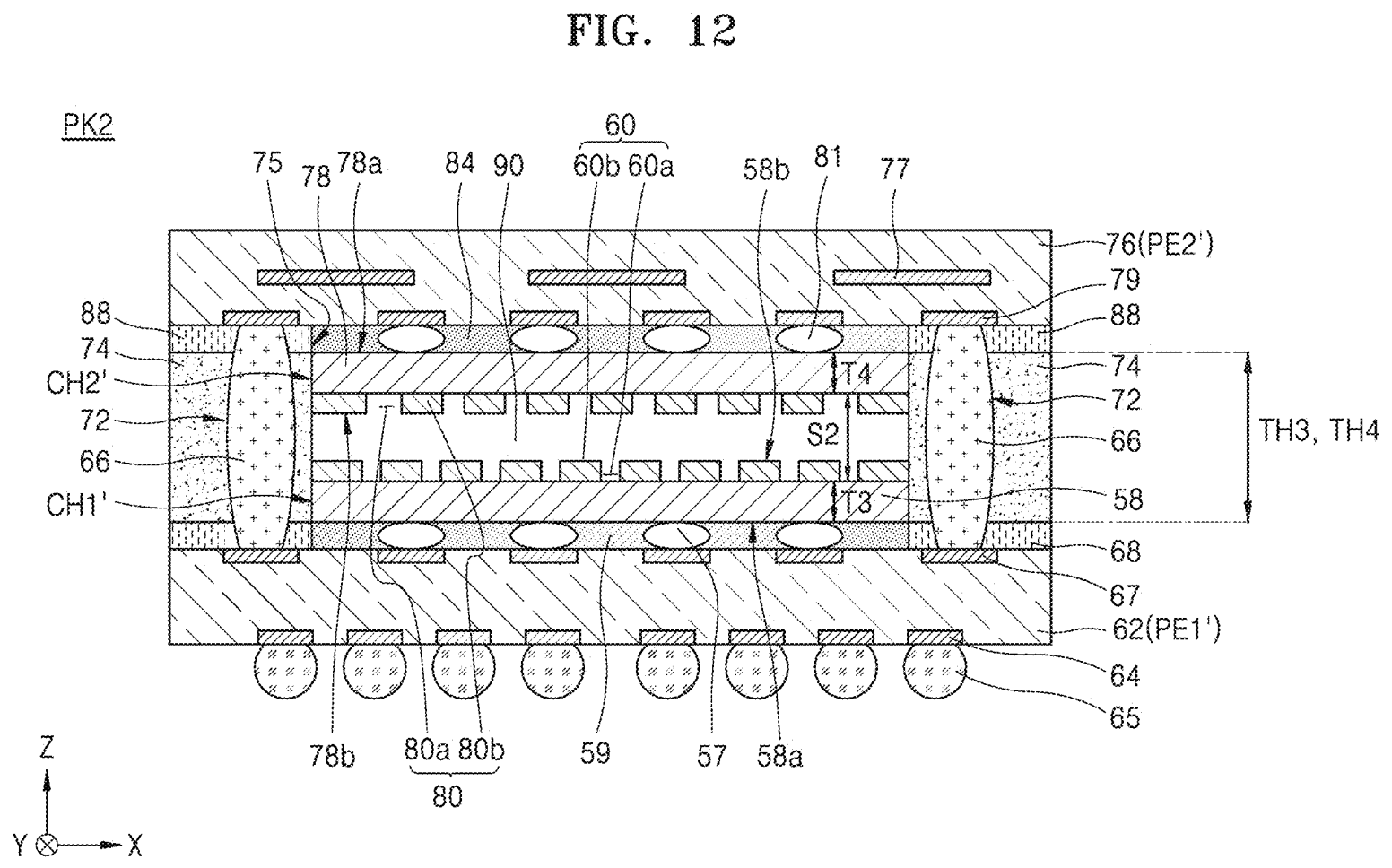

FIG. 12 is a cross-sectional view of a semiconductor package according to an embodiment.

In detail, the semiconductor package PK2 may include a first circuit element PE1' and a first semiconductor chip CH1'. The first semiconductor chip CH1' may be flip-chip bonded to the top surface of the first circuit element PE1'. The first circuit element PE1' may be a first package substrate 62. The first package substrate 62 may be a printed circuit board.

External connection pads 64 and internal connection pads 67 may be arranged on the bottom surface and the top surface of the first circuit element PE1', respectively. An external connection pad 64 and an internal connection pad 67 may each include a metal layer, e.g., a copper layer, a nickel layer, or a gold layer. An external connection terminal 65 may be formed on the external connection pad 64.

The first semiconductor chip CH1' may correspond to the first semiconductor chip CH1 of FIG. 1. The first semiconductor chip CH1' may be the same type of chip as the first semiconductor chip CH1 of FIG. 1. The first semiconductor chip CH1' may include a first chip body 58 having a first front surface 58*a* and a first rear surface 58*b*. The first semiconductor chip CH1', that is, the first chip body 58, may have a first thickness T3. The first thickness T3 may be several hundred um, e.g., from about 100 um to about 400 um.

The first front surface 58*a* may be an active surface, and the first rear surface 58*b* may be an inactive surface. First chip connection balls 57 are arranged on the first front surface 58*a* of the first chip body 58. A first chip connection ball 57 may be a first chip solder ball or a first chip connection bump. The first chip connection balls 57 may be respectively positioned on the internal connection pads 67 and electrically connected to the internal connection pads 67. A first underfill layer 59 is disposed between the first chip connection balls 57 on the first circuit element PE1'.

A first heat dissipation structure 60 having a concave-convex structure may be positioned on the upper portion of the first semiconductor chip CH1'. The first heat dissipation structure 60 may be included in the first semiconductor chip CH1'. The first heat dissipation structure 60 may include a plurality of first concave patterns 60*a* recessed from the first semiconductor chip CH1', that is, from the first rear surface 58*b* of the first chip body 58, and a plurality of first convex patterns 60*b* arranged between the first concave patterns 60*a*.

The first heat dissipation structure 60 may be formed by etching the first rear surface 58*b* of the first chip body 58 through a photolithography process. Since the first semiconductor chip CH1' includes the first heat dissipation structure 60, heat may be easily dissipated from the first semiconductor chip CH1'.

The semiconductor package PK2 may include an insulating plate 74 and a connection member 66 disposed on the insulating plate 74. The insulating plate 74 may be disposed on the first circuit element PE1' to have a first through hole 75 exposing the first semiconductor chip CH1'. The insulating plate 74 may include a resin layer. The first through hole 75 may be a central through hole located in the central portion of the insulating plate 74.

The insulating plate 74 may include a fluid inlet for supplying a fluid onto a plane, that is, an X-Y plane, and a fluid outlet for discharging the fluid, as described later. The planar structure of the insulating plate 74 is described in more detail later.

The insulating plate 74 may be adhered to the first circuit element PE1' through an adhesive layer 68. A thickness TH3 of the insulating plate 74 may be greater than the first thickness T3 of the first semiconductor chip CH1'. Therefore, the first semiconductor chip CH1' may be located inside the first through hole 75.

A second through hole 72 is further formed on one side portion of the insulating plate 74 to be spaced apart from the first semiconductor chip CH1'. The second through hole 72 may be a peripheral through hole located in the periphery of the insulating plate 74. The connection member 66 electrically connected to the first circuit element PE1' may be disposed in the second through hole 72.

The connection member 66 may be a column-like member in which the width of the upper portion thereof is different from the width of the lower portion thereof. The connection member 66 may be a column-like member in which the width of the center portion is greater than the width of the upper portion thereof and the width of the lower portion thereof. The connection member 66 may be a connecting solder ball or a connecting solder bump. The connection member 66 may be electrically connected to an internal connection pad 67 of the first circuit element PE1'.

The semiconductor package PK2 may include a second circuit element PE2' and a second semiconductor chip CH2'. The second circuit element PE2' may be a redistribution level layer 76. The redistribution level layer 76 may include a redistribution layer 77 and lower redistribution pads 79. The second circuit element PE2' may be above the insulating plate 74 and the connection member 66. The second circuit element PE2' may be attached to the insulating plate 74 through an adhesive layer 88.

The second semiconductor chip CH2' may be positioned to be spaced apart from the first semiconductor chip CH1' in a vertical direction (Z direction) inside the first through hole 75. The second semiconductor chip CH2' may be flip-chip bonded to the bottom surface of the second circuit element PE2'.

In some embodiments, the second semiconductor chip CH2' may be the same type of chip as the first semiconductor chip CH1'. In some embodiments, the second semiconductor chip CH2' may be a different type of chip from the first semiconductor chip CH1'.

The second semiconductor chip CH2' may correspond to the second semiconductor chip CH2 of FIG. 1. The second semiconductor chip CH2' may include a second chip body 78 having a second front surface 78*a* and a second rear surface 78*b*. The second front surface 78*a* may be an active surface, and the second rear surface 78*b* may be an inactive surface. Second chip connection balls 81 are arranged on the second front surface 78*a* of the second chip body 78. A second chip connection ball 81 may be a second chip solder ball or a second chip connection bump. A second underfill layer 84 is disposed between the second chip connection balls 81 on the bottom surface of the second circuit element PE2'.

The second semiconductor chip CH2' may have a second thickness T4. The second semiconductor chip CH2', that is, the second chip body 78, may have the second thickness T4. The second thickness T4 may be several hundred um, e.g., from about 100 um to about 400 um.

The above-stated thickness TH3 of the insulating plate 74 may be greater than a thickness TH4, which is the sum of the first thickness T3 of the first semiconductor chip CH1', the second thickness T4 of the second semiconductor chip CH2', and a separation distance S2 between the first chip body 58 and the second chip body 78 in the vertical direction (Z direction). Therefore, the first semiconductor chip CH1' and the second semiconductor chip CH2' may be located inside the first through hole 75.

The thickness TH3 of the insulating plate 74 may be determined by the first thickness T3, the second thickness T4, and the separation distance S2. The thickness TH3 of the insulating plate 74 may be several hundred um, e.g., from about 300 um to 900 um.

The second heat dissipation structure 80 having a concave-convex structure may be positioned on the lower portion of the second semiconductor chip CH2'. The second heat dissipation structure 80 may be included in the second semiconductor chip CH2'. The second heat dissipation structure 80 may include a plurality of second concave patterns 80*a* recessed from the second semiconductor chip CH2', that is, from the second rear surface 78*b* of the second chip body 78, and a plurality of second convex patterns 80*b* arranged between the second concave patterns 80*a*.

The second heat dissipation structure 80 may be formed by etching the second rear surface 78*b* of the second chip body 78 through a photolithography process. Since the second semiconductor chip CH2' includes the second heat dissipation structure 80, heat may be easily dissipated from the second semiconductor chip CH2'.

The semiconductor package PK2 may include a fluid layer 90. The fluid layer 90 may include a liquid or a gas. The fluid layer 90 may include at least any one of ammonia, nitrogen, carbon dioxide, hydrochlorofluorocarbon (HCFC), glycerin, water, and oil.

The fluid layer 90 may be positioned between the first semiconductor chip CH1' and the second semiconductor chip CH2' inside the first through hole 75. The fluid layer 90 may be positioned between the first heat dissipation structure 60 and the second heat dissipation structure 80 inside the first through hole 75.

The fluid layer 90 may be positioned in contact with the first heat dissipation structure 60 and the second heat dissipation structure 80. The fluid layer 90 may be positioned to surround the first concave patterns 60*a* and the first convex patterns 60*b* of the first heat dissipation structure 60. The fluid layer 90 may be positioned to surround the second concave patterns 80*a* and the second convex patterns 80*b* of the second heat dissipation structure 80. The fluid layer 90 may exhibit superior heat dissipation efficiency as compared to a solid layer.

The semiconductor package PK2 may be almost identical to the semiconductor package PK1 of FIG. PK1 except that the second circuit element PE2' is configured as the redistribution level layer 76, a separation distance between the first semiconductor chip CH1' and the second semiconductor chip CH2' is relatively large, and the width of the upper portion of the connection member 66 is different from the width of the lower portion of the connection member 66. Furthermore, the fluid circulation device FLC described with reference to FIG. 7 may be further connected to the semiconductor package PK2.

The semiconductor package PK2 may include the fluid layer 90, thereby facilitating dissipation of heat generated in the first semiconductor chip CH1' and the second semiconductor chip CH2' to the outside. Furthermore, the semiconductor package PK2 includes the first heat dissipation structure 60 and the second heat dissipation structure 80, thereby further facilitating dissipation of heat generated in the first semiconductor chip CH1' and the second semiconductor chip CH2' to the outside.

Figure 13:
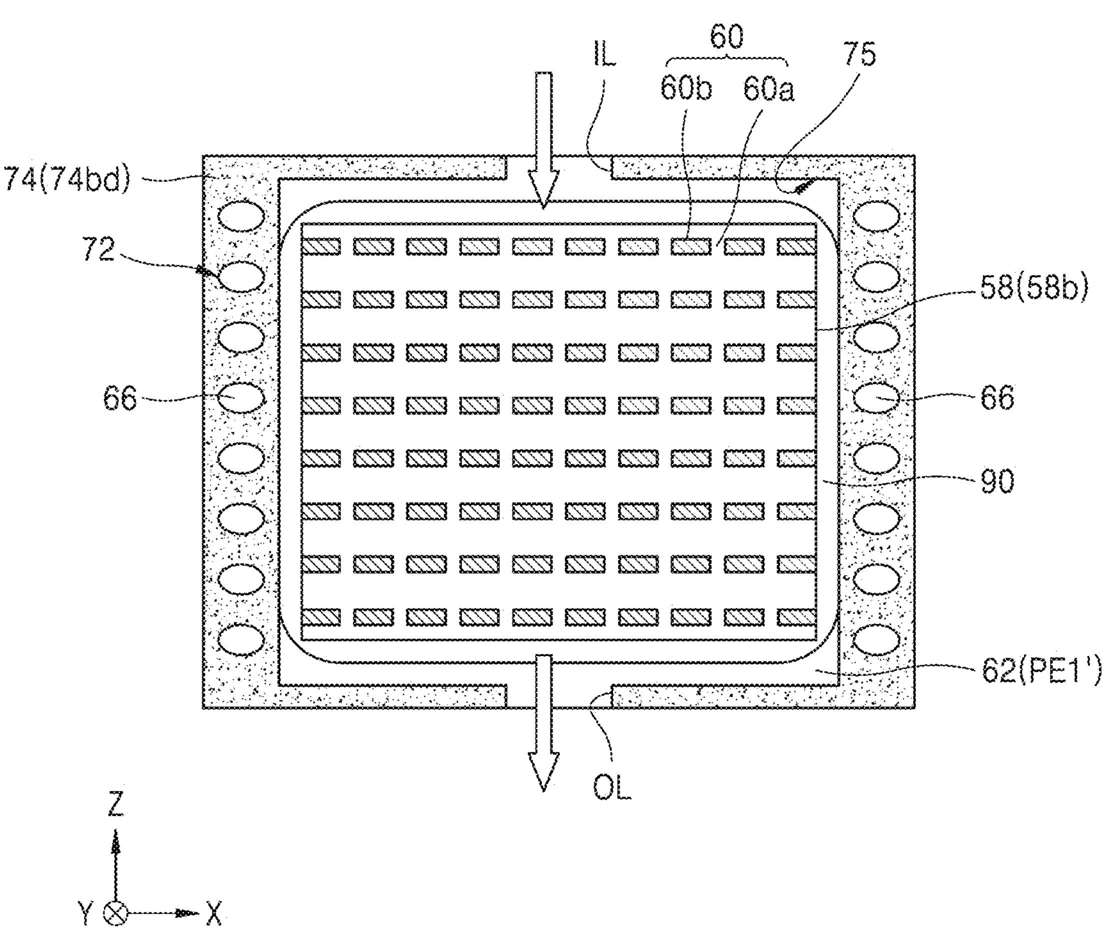
FIG. 13 is a top plan view of a first semiconductor chip, an insulating plate, and a fluid layer included in the semiconductor package of FIG. 12.

FIG. 13 is a top plan view of a first semiconductor chip, an insulating plate, and a fluid layer included in the semiconductor package of FIG. 12.

In FIG. 13, reference numerals identical to those as in FIG. 12 denote the same elements. In FIG. 13, descriptions identical to those given above with reference to FIG. 12 are briefly given or omitted. The insulating plate 74 may include a plate body 74*bd* having the first through hole 75 and second through holes 72, the fluid inlet IL, and the fluid outlet OL.

The first semiconductor chip CH1' may be disposed in the first through hole 75 of the insulating plate 74, that is, the plate body 74*bd*. The first semiconductor chip CH1' may be disposed on a portion of a surface of the first circuit element PE1' as needed as shown in FIG. 13.

The first through hole 75 may be a portion exposing the first semiconductor chip CH1' in the semiconductor package PK2. The first through hole 75 may be a central through hole formed in the central portion of the plate body 74*bd*. The first through hole 75 may be a single through hole penetrating through the plate body 74*bd*.

The second through holes 72 may be a portion in which the connection member 66 is formed. The second through holes 72 may be peripheral through holes formed in the periphery of the plate body 74*bd*. The second through holes 72 may be provided to be spaced apart from one another in the Y direction.

The first chip body 58 having the first rear surface 58*b* of the first semiconductor chip CH1' may be exposed. The first heat dissipation structure 60 including the first concave patterns 60*a* and the first convex patterns 60*b* arranged between the first concave patterns 60*a* may be provided on the first chip body 58.

The first concave patterns 60*a* and the first convex patterns 60*b* may be formed by etching the first rear surface 58*b* of the first chip body 58 through a photolithography process. As described above, the first concave patterns 60*a* may be formed by recessing from the first rear surface 58*b* of the first chip body 58.

The fluid layer 90 supplied through the fluid inlet IL may be disposed on the first chip body 58 of the first semiconductor chip CH1' in the first through hole 75. A fluid supply structure (52 of FIG. 4) may be connected to the fluid inlet IL.

The fluid layer 90 may be in contact with the first heat dissipation structure 60 on the X-Y plane. The fluid layer 90 may contact the first concave patterns 60*a* and the first convex patterns 60*b* of the first heat dissipation structure 60 on the X-Y plane.

The fluid layer 90 supplied onto the first chip body 58 of the first semiconductor chip CH1' in the first through hole 75 may be discharged through the fluid outlet OL. The fluid outlet OL may be connected to a fluid storage (54 of FIG. 4).

Figure 14:
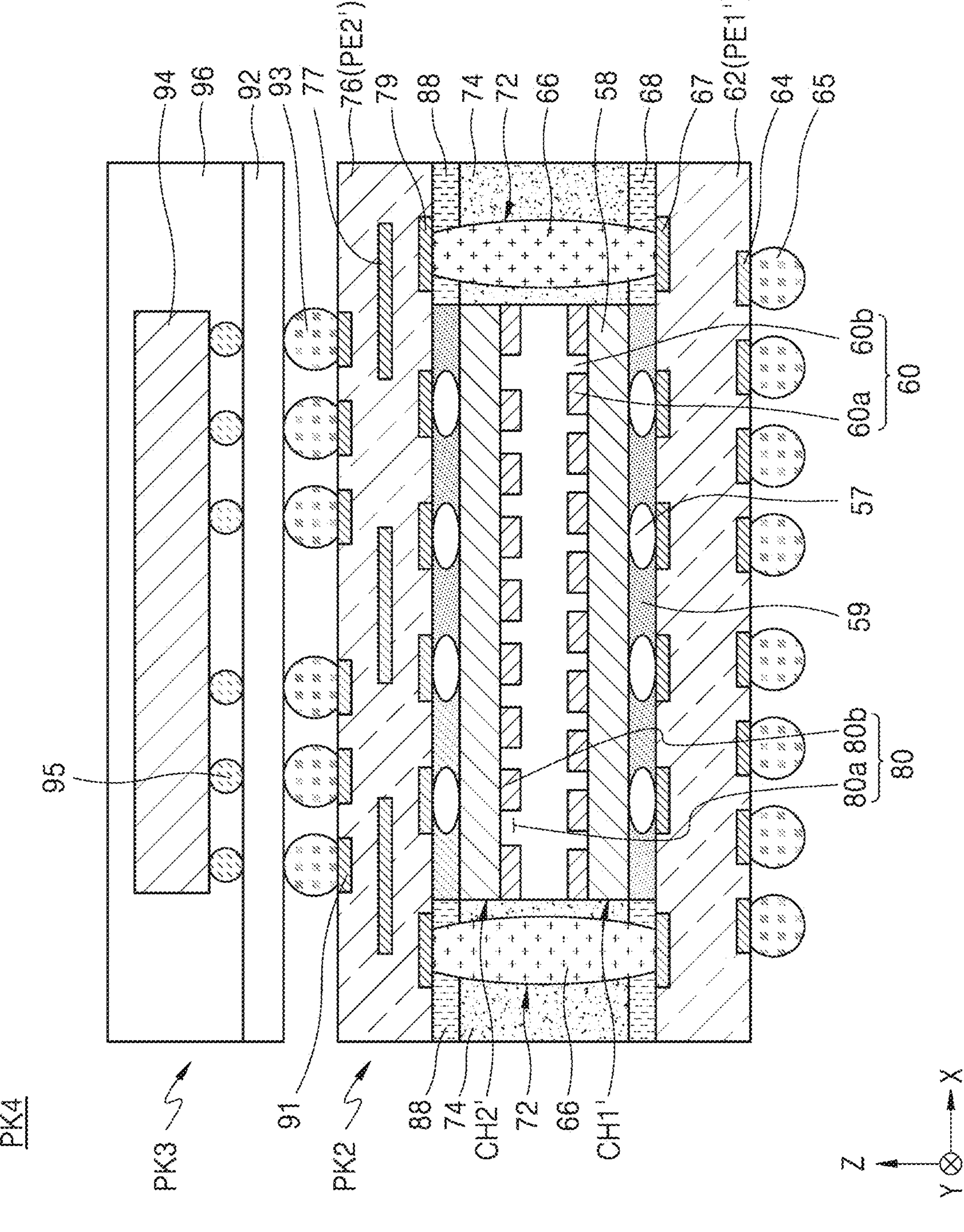
FIG. 14 is a cross-sectional view of a semiconductor package according to an embodiment.

FIG. 14 is a cross-sectional view of a semiconductor package according to an embodiment.

In detail, a semiconductor package PK4 may be the same as the semiconductor package PK2 of FIG. 12, except that a second semiconductor package PK3 is further stacked. In FIG. 14, reference numerals identical to those as in FIG. 12 denote the same elements.

The semiconductor package PK4 includes the semiconductor package PK2 and the second semiconductor package PK3 stacked on the semiconductor package PK2. The semiconductor package PK4 may be a package-on-package (POP)-type package in which a package is stacked on another package. Since the semiconductor package PK2 has been described above, descriptions thereof are briefly given or omitted.

The semiconductor package PK2 may include the second circuit element PE2'. The second circuit element PE2' may be the redistribution level layer 76. The redistribution level layer 76 may include the redistribution layer 77, a lower redistribution pad 79, and an upper redistribution pad 91.

The second semiconductor package PK3 is stacked on the upper redistribution pad 91 of the semiconductor package PK2 through external connection terminals 93 provided therebetween. The second semiconductor package PK3 may include external connection terminals 93 formed below a wiring substrate 92, a third semiconductor chip 94 formed above the wiring substrate 92, third chip connection balls 95 interconnecting the third semiconductor chip 94 and the wiring substrate 92, and an encapsulation layer 96 sealing the third semiconductor chip 94 on the wiring substrate 92.

The wiring substrate 92 may be a printed circuit board. The third semiconductor chip 94 may be the same type chip as or a different type chip from the first semiconductor chip CH1 and the second semiconductor chip CH2 described above. The semiconductor package PK4 as described above includes the fluid layer 90 in the semiconductor package PK2, thereby facilitating dissipation of heat generated in the first semiconductor chip CH1' and the second semiconductor chip CH2' to the outside.

Furthermore, the semiconductor package PK4 includes the first heat dissipation structure 60 and the second heat dissipation structure 80 in the semiconductor package PK2, thereby further facilitating dissipation of heat generated in the first semiconductor chip CH1' and the second semiconductor chip CH2' to the outside.

Figure 15:
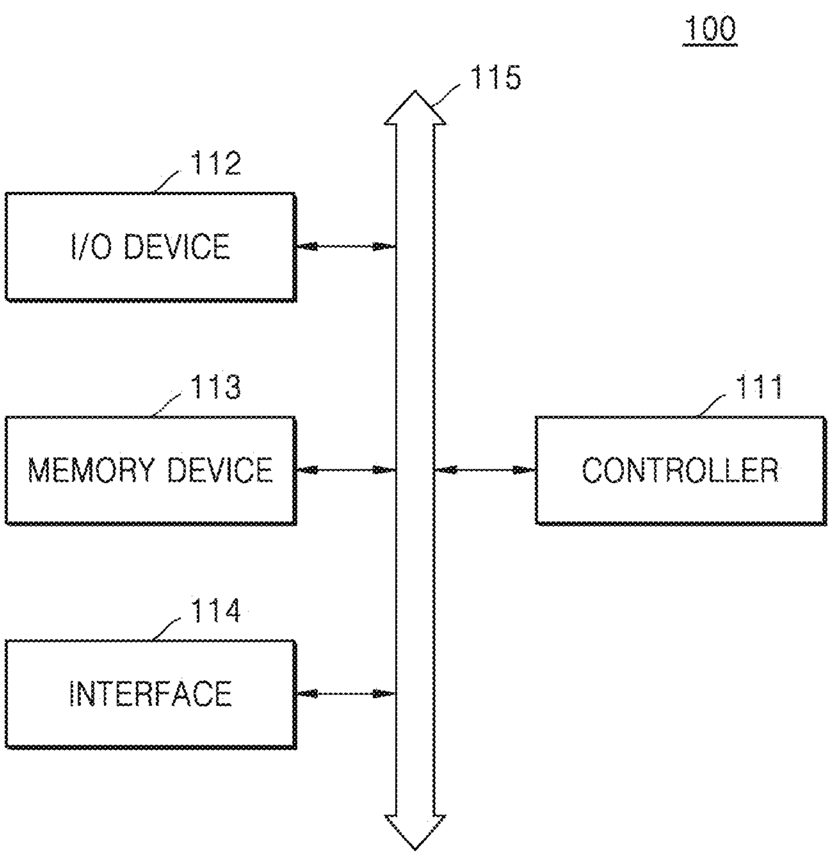
FIG. 15 is a schematic block diagram showing an example of a memory system including a semiconductor package according to an embodiment.

FIG. 15 is a schematic block diagram showing an example of a memory system including a semiconductor package according to an embodiment.

In detail, a memory system 100 may be applied to a personal digital assistant (PDA), a portable computer, a web tablet, a wireless phone, a mobile phone, a digital music player, a memory card, or any device capable of transmitting and/or receiving information in a wireless environment.

The memory system 100 includes a controller 111, an input/output (I/O) device 112 like a keypad, a keyboard, and a display, a memory device (or a memory chip) 113, an interface 114, and a bus 115. The memory device 113 and the interface 114 communicate with each other via the bus 115.

The controller 111 includes at least one of a microprocessor, a digital signal processor, a microcontroller, or other similar processing devices. The memory device 113 may be used to store a command executed by the controller 111. The I/O device 112 may receive data or signals from outside the memory system 100 or may output data or signals to the outside of the memory system 100. For example, the I/O device 112 may include a keyboard, a keypad, or a display device.

The memory device 113 and the controller 111 may include semiconductor packages PK1, PK2, and PK4 according to embodiments. The memory device 313 may further include other types of memories, volatile memories that may be randomly accessed at any time, and various other types of memories. The interface 114 may transmit data to or receive data from a communication network.

Figure 16:
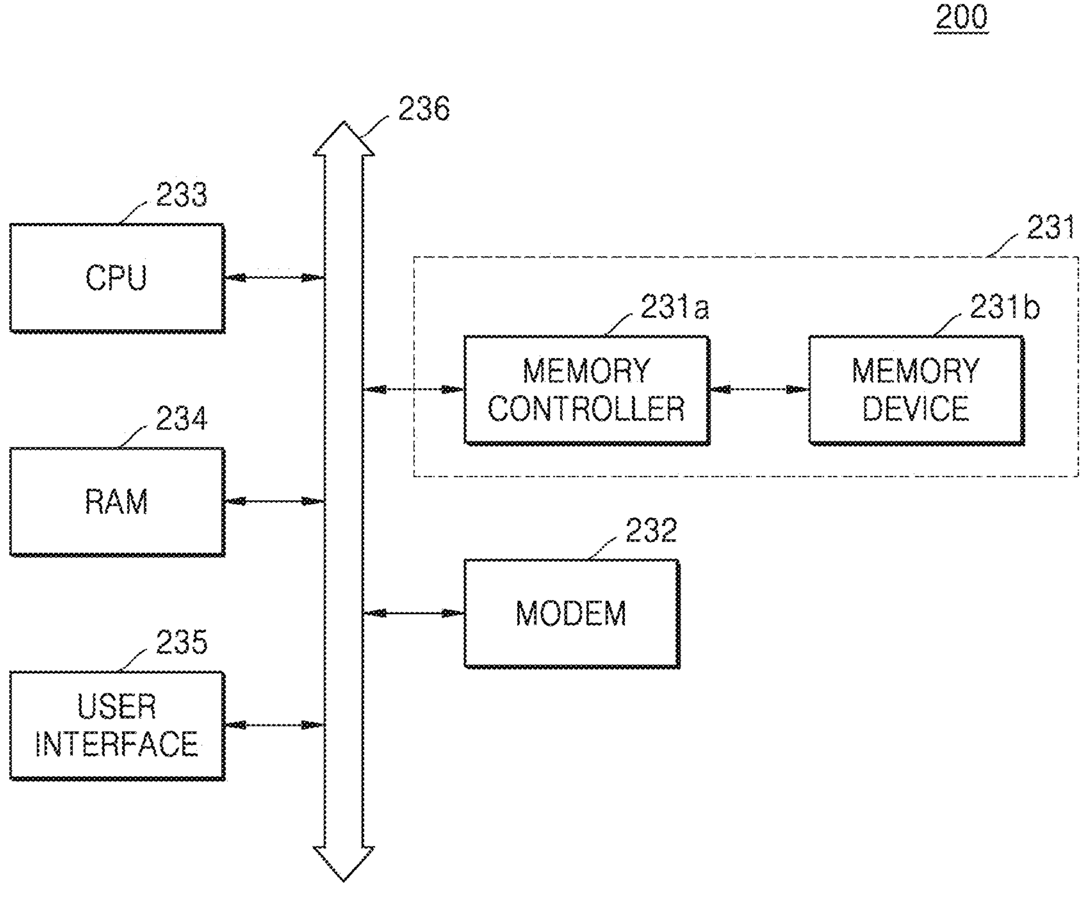
FIG. 16 is a schematic block diagram showing an example of an information processing system including a semiconductor package according to an embodiment.

FIG. 16 is a schematic block diagram showing an example of an information processing system including a semiconductor package according to an embodiment.

In detail, an information processing system 200 may be used in a mobile device or a desktop computer. The information processing system 200 may include a memory system 231 including a memory controller 231*a* and a memory device 231*b*.

The information processing system 200 includes a modulator-and-demodulator (modem) 232 electrically coupled to a system bus 236, a central processing unit (CPU) 233, a RAM 234, and a user interface 235. Data processed by the CPU 233 or data input from the outside is stored in the memory system 231.

The memory system 231 including the memory controller 231*a* and the memory device 231*b*, the modem 232, the CPU 233, and the RAM 234 may include the semiconductor packages PK1, PK2, and PK4 according to embodiments.

The memory system 231 may be configured as a solid state drive. In this case, the information processing system 200 may stably store a large amount of data in the memory system 231. Also, as reliability increases, the memory system 231 may reduce resources needed for error correction, thereby providing a high-speed data exchange function to the information processing system 200.

Although not shown, the information processing system 200 may further include an application chipset, a camera image signal processor (ISP), an I/O device, etc.

One or more of the elements disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU) , an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

While some inventive concepts have been particularly shown and described with reference to embodiments thereof, it will be understood that various changes in form and details may be made therein without departing from the spirit and scope of the following claims.

What is claimed is:

1. A semiconductor package comprising:

a first circuit element;

a first semiconductor chip flip-chip bonded to a top surface of the first circuit element;

an insulating plate on the first circuit element, the insulating plate having a first through hole and a second through hole, the first through hole exposing the first semiconductor chip, the second through hole on one side of the insulating plate and spaced apart from the first semiconductor chip;

a connection member in the second through hole and electrically connected to the first circuit element;

a second circuit element on the connection member and the insulating plate, the second circuit element being electrically connected to the connection member;

a second semiconductor chip, the second semiconductor chip being spaced apart from the first semiconductor chip in the first through hole and flip-chip bonded to a bottom surface of the second circuit element;

a fluid layer in the first through hole between the first semiconductor chip and the second semiconductor chip;

a first heat dissipation structure having a plurality of first patterns that are laterally spaced apart from each other on an upper portion of the first semiconductor chip;

a second heat dissipation structure having a plurality of second patterns that are laterally spaced apart from each other on a lower portion of the second semiconductor chip; and an adhesive layer bonding some of the plurality of first patterns to some of the plurality of second patterns, wherein the plurality of first patterns are spaced apart from the plurality of second patterns with the fluid layer therebetween, and a vertical gap spacing between the plurality of first patterns and the plurality of second patterns corresponds to a thickness of the adhesive layer.

2. The semiconductor package of claim 1, wherein the first circuit element comprises a first package substrate, and the second circuit element comprises a redistribution level layer.

3. The semiconductor package of claim 1, wherein the first circuit element comprises a first package substrate, and the second circuit element comprises a second package substrate.

4. The semiconductor package of claim 1, wherein the adhesive layer includes a first adhesive portion spaced apart laterally from a second adhesive portion, the some of the plurality of first patterns include a first outermost first pattern and a second outermost first pattern that respectively are laterally spaced apart from each other on a first end of the upper portion of the first semiconductor chip and a second end of the upper portion of the first semiconductor chip, the some of the plurality of second patterns include a first outermost second pattern and a second outermost second pattern that respectively are laterally spaced apart from each other on a first end of the lower portion of the second semiconductor chip and a second end of the lower portion of the first semiconductor chip, the first adhesive portion connects the first outermost first pattern to the first outermost second pattern, and the second adhesive portion connects the second outermost first pattern to the second outermost second pattern.

5. The semiconductor package of claim 1, wherein the fluid layer contacts the first heat dissipation structure and the second heat dissipation structure.

6. The semiconductor package of claim 1, wherein the insulating plate comprises a fluid inlet and a fluid outlet, the fluid outlet is opposite the fluid inlet and in fluid communication with the fluid inlet, the fluid inlet and the fluid outlet are in a flow path for supplying a fluid between the first semiconductor chip and the second semiconductor chip in a planar view and for discharging the fluid.

7. The semiconductor package of claim 6, further comprising:

a fluid circulation device connected to the fluid inlet and the fluid outlet, wherein the fluid circulation device is in fluid communication with the fluid inlet and the fluid outlet, and the fluid circulation device is configured to circulate the fluid between the first semiconductor chip and the second semiconductor chip.

8. The semiconductor package of claim 6, further comprising:

a first sealing portion and a second sealing portion in the fluid inlet and the fluid outlet, respectively, wherein the first sealing portion and the second sealing portion are configured to limit a loss of the fluid if the fluid is supplied between the first semiconductor chip and the second semiconductor chip, respectively.

9. The semiconductor package of claim 1, wherein the connection member comprises a column-like member.

10. A semiconductor package comprising:

a first circuit element;

a first semiconductor chip flip-chip bonded to a top surface of the first circuit element;

a first heat dissipation structure on a rear surface of the first semiconductor chip, the first heat dissipation structure including a plurality of first patterns spaced apart from each other on the rear surface of the first semiconductor chip;

an insulating plate on the first circuit element, the insulating plate having a first through hole and a second through hole, the first through hole exposing the first semiconductor chip, the second through hole on one side of the insulating plate and spaced apart from the first semiconductor chip;

a connection member in the second through hole and electrically connected to the first circuit element;

a second circuit element on the connection member and the insulating plate, the second circuit element electrically connected to the connection member;

a second semiconductor chip, the second semiconductor chip being spaced apart from the first semiconductor chip in the first through hole and flip-chip bonded to a bottom surface of the second circuit element;

a second heat dissipation structure on a rear surface of the second semiconductor chip, the second heat dissipation structure including a plurality of second patterns spaced apart from each other on the rear surface of the second semiconductor chip;

an adhesive layer bonding some of the plurality of first patterns to some of the plurality of second patterns; and a fluid layer between the first heat dissipation structure and the second heat dissipation structure in the first through hole, wherein a vertical gap spacing between the plurality of first patterns and the plurality of second patterns corresponds to a thickness of the adhesive layer.

11. The semiconductor package of claim 10, wherein the fluid layer contacts the plurality of first patterns and the plurality of second patterns.

12. The semiconductor package of claim 10, wherein the insulating plate comprises a fluid inlet and a fluid outlet, the fluid outlet is opposite the fluid inlet and in fluid communication with the fluid inlet, the fluid inlet and the fluid outlet are in a flow path for supplying a fluid between the first heat dissipation structure and the second heat dissipation structure in a planar view and for discharging the fluid.

13. The semiconductor package of claim 12, further comprising:

a fluid circulation device connected to the fluid inlet and the fluid outlet, wherein the fluid circulation device is in fluid communication with the fluid inlet and the fluid outlet, and the fluid circulation device is configured to circulate the fluid between the first heat dissipation structure and the second heat dissipation structure.

14. The semiconductor package of claim 13, wherein the fluid circulation device includes a fluid supply structure connected to the fluid inlet, a fluid storage connected to the fluid outlet, and a pump connected to the fluid supply structure and the fluid storage.

15. The semiconductor package of claim 12, further comprising:

a first sealing portion and a second sealing portion in the fluid inlet and the fluid outlet, respectively, wherein the first sealing portion and the second sealing portion are configured to limit loss of the fluid supplied between the first heat dissipation structure and the second heat dissipation structure, respectively.

16. A semiconductor package comprising:

a first circuit element including a first package substrate;

a first semiconductor chip electrically connected to the first circuit element through first chip connection balls, the first semiconductor chip including a first chip body and the first chip connection balls, the first chip body including a first front surface and a first rear surface opposite the first front surface, the first chip connection balls being on the first front surface of the first chip body;

a first heat dissipation structure including a plurality of first patterns on the first rear surface of the first semiconductor chip and spaced apart from each other;

an insulating plate on the first circuit element, the insulating plate having a first through hole and a second through hole, the first through hole exposing the first semiconductor chip, the second through hole on one side of the insulating plate and spaced apart from the first semiconductor chip;

a connection member in the second through hole and electrically connected to the first circuit element;

a second circuit element on the connection member and the insulating plate, the second circuit element being electrically connected to the connection member, and the second circuit element including a redistribution level layer;

a second semiconductor chip electrically connected to the second circuit element through second chip connection balls, the second semiconductor chip being spaced apart from the first semiconductor chip in the first through hole, the second semiconductor chip including a second chip body and the second chip connection balls, the second chip body having a second front surface and a second rear surface opposite the second front surface, the second chip connection balls being on the second rear surface of the second chip body, and the second semiconductor chip being spaced apart from the first semiconductor chip in the first through hole;

a second heat dissipation structure on a second rear surface of the second semiconductor chip, the second heat dissipation structure including a plurality of second patterns on the second rear surface of the second semiconductor chip and spaced apart from each other; and an adhesive layer bonding some of the plurality of first patterns to some of the plurality of second patterns; and a fluid layer between the first heat dissipation structure and the second heat dissipation structure in the first through hole, wherein a vertical gap spacing between the plurality of first patterns and the plurality of second patterns corresponds to a thickness of the adhesive layer.

17. The semiconductor package of claim 16, further comprising:

a fluid circulation device, wherein the insulating plate comprises a fluid inlet and a fluid outlet, the fluid outlet is opposite the fluid inlet and in fluid communication with the fluid inlet, the fluid inlet and the fluid outlet are in a flow path for supplying a fluid between the first heat dissipation structure and the second heat dissipation structure in a planar view and for discharging the fluid, and the fluid circulation device is configured to circulate the fluid between the first heat dissipation structure and the second heat dissipation structure.

18. The semiconductor package of claim 16, wherein a thickness of the insulating plate is greater than a total thickness, and the total thickness is a sum of a thickness of the first chip body, a thickness of the second chip body, and a separation distance between the first chip body and the second chip body.

19. The semiconductor package of claim 16, wherein a thickness of the insulating plate is equal to a total thickness, and the total thickness is a sum of a thickness of the first chip body, a thickness of the second chip body, and a separation distance between the first chip body and the second chip body.

* * * * *